United States Patent [19]

So

[11] Patent Number: 5,307,008
[45] Date of Patent: Apr. 26, 1994

[54] CURRENT RATIO DEVICE AND TOROIDAL CORE ASSEMBLY THEREFOR

[75] Inventor: Eddy So, Gloucester, Canada

[73] Assignee: National Research Council of Canada, Ottawa, Canada

[21] Appl. No.: 787,086

[22] Filed: Nov. 4, 1991

[51] Int. Cl.$^5$ .................. G01R 21/133; H03K 13/02
[52] U.S. Cl. ........................... 323/357; 324/117 R; 324/124; 336/176
[58] Field of Search .................. 324/127, 726, 117 R; 323/357; 336/92, 84 R, 174, 175, 176

[56] References Cited

U.S. PATENT DOCUMENTS

| | | | |
|---|---|---|---|
| 3,153,758 | 10/1964 | Kusters et al. | |
| 3,188,562 | 6/1965 | Kusters et al. | 324/726 |
| 3,500,171 | 3/1970 | Kusters et al. | 324/117 R |
| 3,534,247 | 10/1970 | Miljanic . | |
| 3,750,071 | 7/1973 | Eley | 336/84 |
| 4,263,549 | 4/1981 | Toppeto | 324/127 |
| 4,274,052 | 6/1981 | Gentry, Jr. et al. | 324/117 R |
| 4,378,525 | 3/1983 | Bardick | 324/127 |
| 4,638,302 | 1/1987 | So | 340/347 DA |
| 4,799,005 | 1/1989 | Fernandes | 324/127 |
| 4,841,236 | 6/1989 | Miljanic et al. | 324/127 |
| 4,901,010 | 2/1990 | Bernard | 324/117 R |
| 4,972,167 | 11/1990 | Fujioka | 336/92 |
| 5,119,059 | 6/1992 | Covi et al. | 336/175 |

OTHER PUBLICATIONS

Miljanic et al., "An Electronically Enhanced Mangetic Core for Current Transformers", IEEE Transactions on Instrumentation and Measurement, vol. 40, No. 2, Apr. 1991.

McMartin et al., "A Self-Balancing Direct Current Comparator for 20 000 Amperes", IEEE Transactions on Magnetics, vol. Mag-1, No. 4, pp. 396-402 (1966).

*Primary Examiner*—Steven L. Stephan
*Assistant Examiner*—B. Davidson

[57] ABSTRACT

A current ratio device is used for forming a current transformer that can accurately scale down high currents to usable metering levels. The transformer has associated circuitry that renders it capable of functioning not only with ac and a mixture of ac and dc, but also when dc alone is present in the primary winding. The device employs a toroidal core and winding assembly that is cut along a plane containing the toroidal axis through a pair of diametrically opposite sections of the assembly that contain no windings, in order to separate the device into a pair of sub-assemblies that can be readily placed over a single turn primary, e.g. a busbar, without dismantling the same. Once so placed, the sub-assemblies can then be clamped together again to re-form the device and the winding portions externally connected to the circuitry, the latter being such as to avoid the accuracy of measurement being significantly effected by the unavoidable increase in core reluctance that will have resulted from the separation of the core assembly into two sub-assemblies.

20 Claims, 6 Drawing Sheets

CURRENT RATIO DEVICE AND TOROIDAL CORE ASSEMBLY THEREFOR

FIELD OF THE INVENTION

The invention relates to a current ratio device that can be used to construct an improved current transformer, and more particularly a current transformer capable of accurately scaling high alternating and direct currents down to usable metering levels, for use in the measurement of electric power and energy.

The invention also relates to a toroidal core and winding assembly for use with such a current ratio device.

BACKGROUND OF THE INVENTION

Petar N. Miljanic et al in an article "An Electronically Enhanced Magnetic Core for Current Transformers" published in IEEE Transactions on Instrumentation and Measurement, Vol 40, No. 2, pp 410–414, April, 1991 (see also U.S. Pat. No. 4,841,236 issued Jun. 20, 1989) have described a technique that increases the apparent permeability of the magnetic core of a current transformer by electronically providing the magnetizing current for the core, whereby the ratio between the primary and secondary currents is rendered virtually without error.

There are two basic limitations in the various devices that have been disclosed by Miljanic et al for carrying this technique into practice.

First, while the above disclosure provided for current transformers that can operate with pure ac, or with a mixture of ac and dc, operation with dc alone was not possible.

Second, the devices were not structurally adapted for easy use with busbars. For on-site measurement of high currents in a busbar that is part of an already installed system, it is inconvenient to have to dismantle the busbar in order to thread a toroidal core onto it from one end, as is necessary if the busbar is to form a single turn primary to generate currents in a secondary winding formed on the core. This problem has been addressed in the past in some hand-held metering devices by making the transformer core in two parts that are pivoted together and can be opened to be placed over the busbar from a side thereof and then closed when in place to surround the busbar. The problem with "openable" cores of this type, however, has been the loss of accuracy that results from the increased reluctance in the core that arises from the unavoidable air gap where the two parts of the core come together. No matter how smoothly polished the mating end faces of such a core are made, the result is always a significant increase in reluctance relative to that of an uninterrupted toroidal core.

SUMMARY OF THE INVENTION

The present invention has the objective of overcoming at least one of the foregoing limitations. The preferred embodiments of the invention serve to overcome both of such limitations simultaneously, namely to provide a device that is openable to embrace a fixed busbar from its side without loss of measurement accuracy, while also being capable of measuring direct current alone, as well as continuing to be able to measure alternating current alone or mixtures of alternating and direct currents.

According to the invention, this latter requirement is met by adding to a circuit, such as disclosed by Miljanic et al, a magnetic modulator plus an associated demodulator that act together to generate and detect even harmonics that result from dc in the primary winding. The demodulator generates a dc signal that is amplified to provide a feedback dc current which is returned to the transformer windings while also flowing in the burden.

More specifically, in this aspect, the invention relates to a current ratio device for use in constructing a current transformer for measuring alternating current alone, direct current alone, or a mixture of alternating and direct currents simultaneously, the device comprising a first magnetic core, a second magnetic core, a measuring winding electromagnetically coupled with the first core but not with the second core, an alternating current amplifier having an input connected to receive an alternating waveform that appears across the measuring winding, and outer winding means electromagnetically coupled with both the first and second cores, the outer winding means including a secondary winding for connection across a measuring burden. The output of the amplifier is connected to the outer winding means to provide a magnetizing current required to magnetize the second core when a primary winding is electromagnetically coupled with the first and second cores and an alternating current flows in such primary winding. The structure so far described is known from the Miljanic et al disclosure.

The present invention is characterized by the addition of modulation magnetic core means, and modulation winding means that are electromagnetically coupled with the modulation core means but not with the first and second cores, the outer winding means also being electromagnetically coupled with the modulation core means. Modulating means are connected to drive the modulation core means alternately into saturation, and demodulating and amplifying means are provided to detect even harmonics in the modulation core means that result from direct current in the primary winding and to generate a corresponding direct current output that is connected to the outer winding means to form therewith a direct current series circuit that also includes the burden. This circuit can also include means for measuring the direct current therein, such as a resister, the voltage across which provides such measurement, or an ammeter.

In a structural aspect, the invention comprises a toroidal core assembly having at least one winding wound on it, each such winding being divided into a pair of separate portions, with each portion extending around the core assembly for a major part of a respective opposite half thereof in such a way as to define between the portions a pair of diametrically opposite "unwound" core sections, i.e. sections without any windings thereon.

This construction can be adapted for convenient use with an already installed busbar by cutting through both the unwound core sections along a plane that extends across the toroidal assembly while containing its axis, the result being to separate the assembly into a pair of sub-assemblies that, after being placed over a single turn primary, e.g. a busbar, can be clamped back together to reform the assembly.

In another structural aspect, the invention provides a toroidal core assembly for use with the above described current ratio device, such assembly comprising a toroidal magnetic outer core having a cross-section that consists of a closed peripheral portion and a central bridging portion interconnecting opposite regions of the peripheral portion in such a manner as to define a pair of cavities surrounded by the core. A first inner core is located in one of these cavities and a first inner winding is wound around this inner core to couple electromagnetically with it but not to couple electromagnetically with the outer core. A pair of further inner cores is located in the other one of the cavities, each such further inner core having a further inner winding wound around it to couple electromagnetically with it but not to couple electromagnetically with any of the other cores. Finally, outer winding means are wound around the peripheral portion of the outer core so as to couple electromagnetically with all the cores.

DETAILED DESCRIPTION OF THE PRIOR ART

Figure 1:
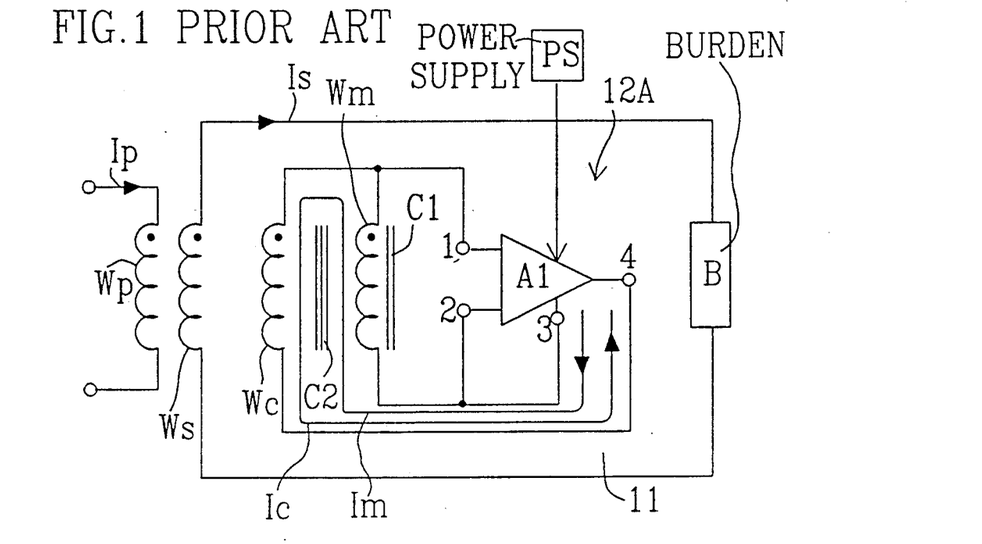
FIG. 1 is a prior art circuit diagram and is substantially identical to FIG. 1 of the Miljanic et al U.S. patent referred to above.

The prior art circuit of FIG. 1 shows a current transformer with two cores C1 and C2. While these cores can be located side-by-side, as shown in FIG. 3 of an earlier Miljanic U.S. Pat. No. 3,534,247 issued Oct. 13, 1970, it is preferred to employ a configuration in which the core C2 is a hollow toroid that encloses and shields the core C1, as shown in FIG. 4 of such earlier patent and described in more detail below. Such a transformer structure had already been described in principle in U.S. Pat. No. 3,153,758 issued Oct. 20, 1964 to N. L. Kusters et al.

The outer core C2 couples electromagnetically with three windings that are outside it, namely a primary winding Wp, a secondary winding Ws and an auxiliary or "compensating" winding Wc, but does not couple electromagnetically with a fourth, sensing or "measuring" winding Wm that is wound on the core C1 inside the core C2. The inner core C1 couples electromagnetically with all four windings. In the normal manner of a current transformer, an input or primary current Ip flows in the primary winding Wp, and an output or secondary current Is flows in the secondary winding Ws and a burden B which will be a very low impedance, current measuring instrument.

Since a component of the input current Ip is required to magnetize the outer or second core C2, the secondary current Is is deficient by a corresponding amount, and the theoretical equality of ampere turns between the primary and secondary circuits contains an error, such error being expressed as the magnetizing current. The flux in the core C2 corresponding to this magnetizing current is sensed by the measuring winding Wm which acts with the inner or first core C1 to generate a current Im in the winding Wm that is equal to the magnetizing current.

The ends of the winding Wm are connected to input terminals 1, 2 of an inverting amplifier A1 so that such input receives the current in this measuring winding Wm. The amplifier A1 has an external power supply PS and a gain that is such that no appreciable voltage is permitted to remain across the terminals 1, 2. The output terminals 3, 4 of the amplifier A1 form a series circuit through windings Wm and Wc so that the current Im passing in one direction through the winding Wm is equal to the current Ic passing in the other direction through the winding Wc. Hence, in this case, the compensating current Ic equals the measuring current Im and becomes equal to the magnetizing current, thus supplying the necessary magnetizing current for the core C2. This arrangement eliminates the need for this magnetizing current to be supplied from the primary current Ip. As a result, the true equality of the ampere turns in the primary and secondary windings is not upset by the need to supply a magnetizing current. It should be noted that this is a compensation circuit rather than a typical feedback circuit.

It should also be noted that the amplifier input terminals 1, 2 need not necessarily be connected directly across the measuring winding Wm. There could be an interposed transformer, as in the arrangement shown in FIG. 2 of the earlier Miljanic U.S. Pat. No. 3,534,247 referred to above. The important concern is that the amplifier input receives the measuring winding waveform.

FIG. 6 of the Miljanic et al U.S. Pat. No. 4,841,236 referred to above discloses a further modification of this current ratio device, that can simultaneously measure any dc current that is mixed with the ac current in the primary winding Wp, but, as indicated above, none of the circuits disclosed by Miljanic et al can measure direct current alone, i.e. in the absence of some ac in the primary winding, because there would then be no electromagnetic coupling between the windings and the cores.

DETAILED DESCRIPTION OF THE EMBODIMENTS OF THE PRESENT INVENTION

Figure 2:
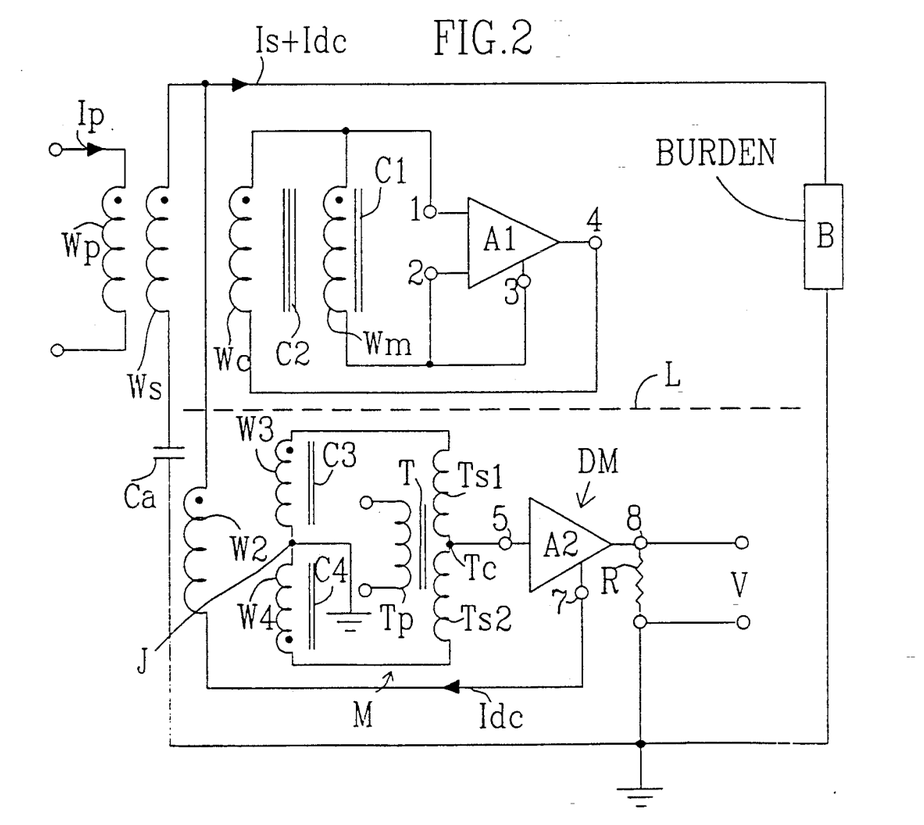
FIG. 2 is a modification of the diagram of FIG. 1 illustrating a first embodiment of the present invention in a circuit aspect.
Figure 10:
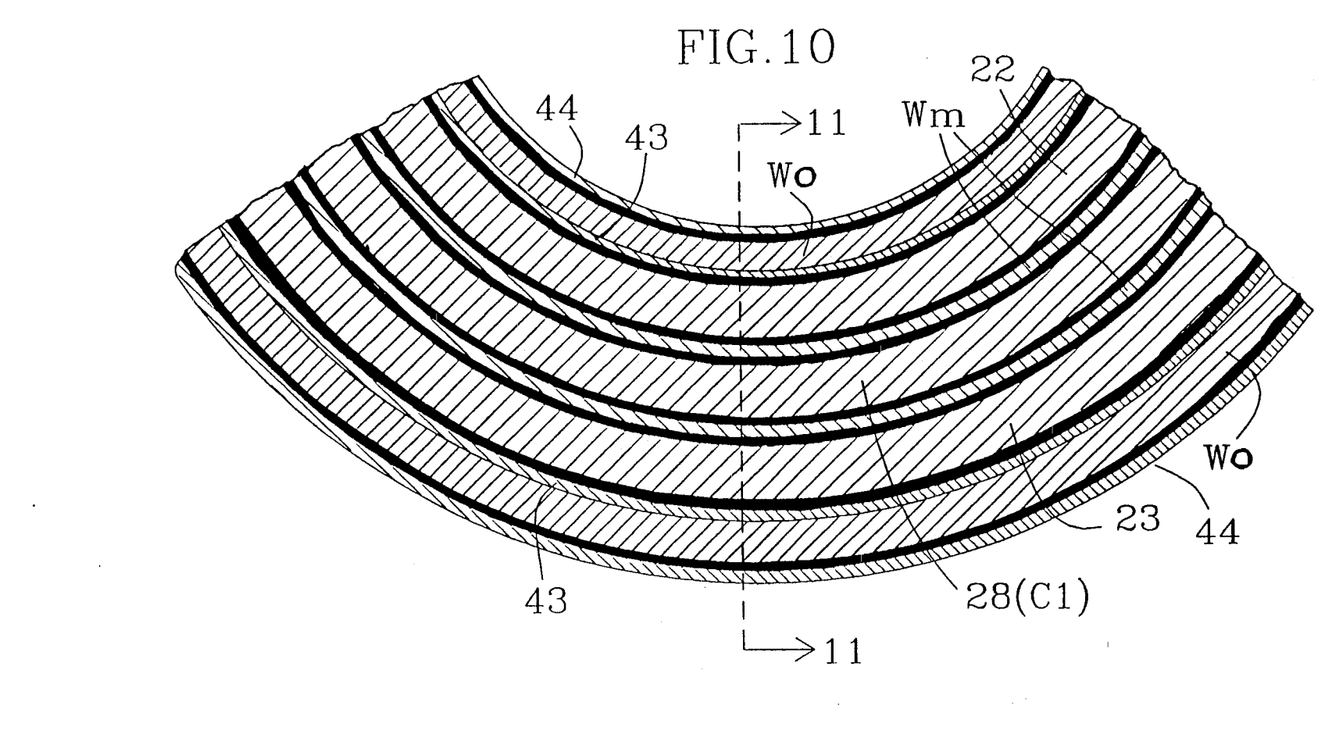
FIG. 10 is a fragment of the assembly of FIG. 8 seen on a larger scale and as a section on the line 10—10 in FIG. 11.
Figure 11:
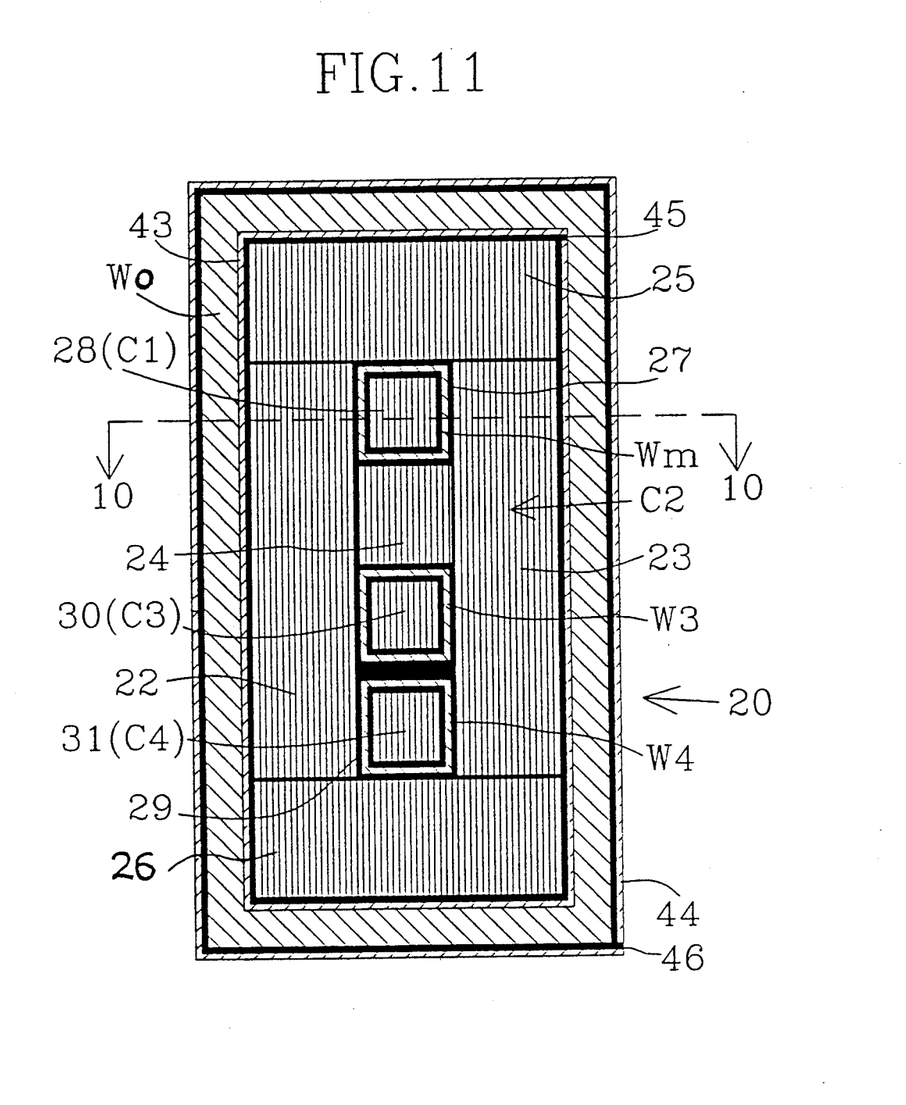
FIG. 11 is a cross-section taken on the line 11—11 in FIG. 10.

This limitation of the prior art is overcome by the embodiment of the present invention shown in FIG. 2 which adds to the circuit of FIG. 1 two additional modulation cores C3 and C4 each with a respective associated modulation winding W3, W4. These latter cores and windings are located inside the main core C2 in the same manner as the core C1 and the winding Wm, as shown in FIGS. 10 and 11. The windings W3, W4 are energized by a magnetic oscillator or "modulator" M that in the present embodiment takes the form of a transformer T the primary winding Tp of which is connected to an alternating power supply (not shown), and the secondary winding of which is divided into two halves Ts1 and Ts2 at a center point Tc, these two halves of the secondary winding being respectively connected across each of the windings W3, W4, the junction J between windings W3 and W4 being connected to ground. The cores C3, C4 are made of a material of sufficiently high permeability to be able to be driven into saturation twice per cycle by the transformer T. If a direct current flows in the primary winding Wp, a signal is generated by the cores C3, C4, that contains even harmonics of the modulation frequency of these cores. This signal is converted to dc by a demodulator DM which in the present embodiment takes the form of a demodulating circuit embodied in a dc feedback amplifier A2, the input terminal 5 of which is connected to the center point Tc.

The magnetic modulation and demodulation performed by this portion of the circuit is a known technique, having been explained in detail in "A Self-Balancing Direct Current Comparator for 20,000 Amperes" by M. P. MacMartin et al, published in IEEE Transactions on Magnetics, Vol. Mag-1, No. 4, pp 396–402 (1966).

Output terminals 7, 8 of the amplifier A2 are connected across a series circuit consisting of an additional dc winding W2 (located outside the core C2), the burden B and a resistor R across which there appears a voltage V that can be measured to determine the magnitude of the dc current in the winding W2. A capacitor Ca is connected in series with the secondary winding Ws to avoid direct current from the winding W2 flowing back to the amplifier A2 through the winding Ws.

The ampere-turns of the direct current Idc in the winding W2 and the burden B is theoretically equal and opposite to the ampere-turns of the dc component of the input current Ip in the primary winding Wp, and the higher the gain of the amplifier A2, the more closely this equality is approached.

The total current Is+Idc in the burden B is now a measure of the combined ac and dc in the input current Ip, while the current in the resistor R (voltage V) is a measure of the dc component of this combined current. This direct current appears in the resistor R even when the ac component is zero.

FIG. 2 includes a broken line L that signifies how the circuit can be viewed functionally as divided into an ac measuring portion (above the line L) and a dc measuring portion (below the line L).

Figure 3:
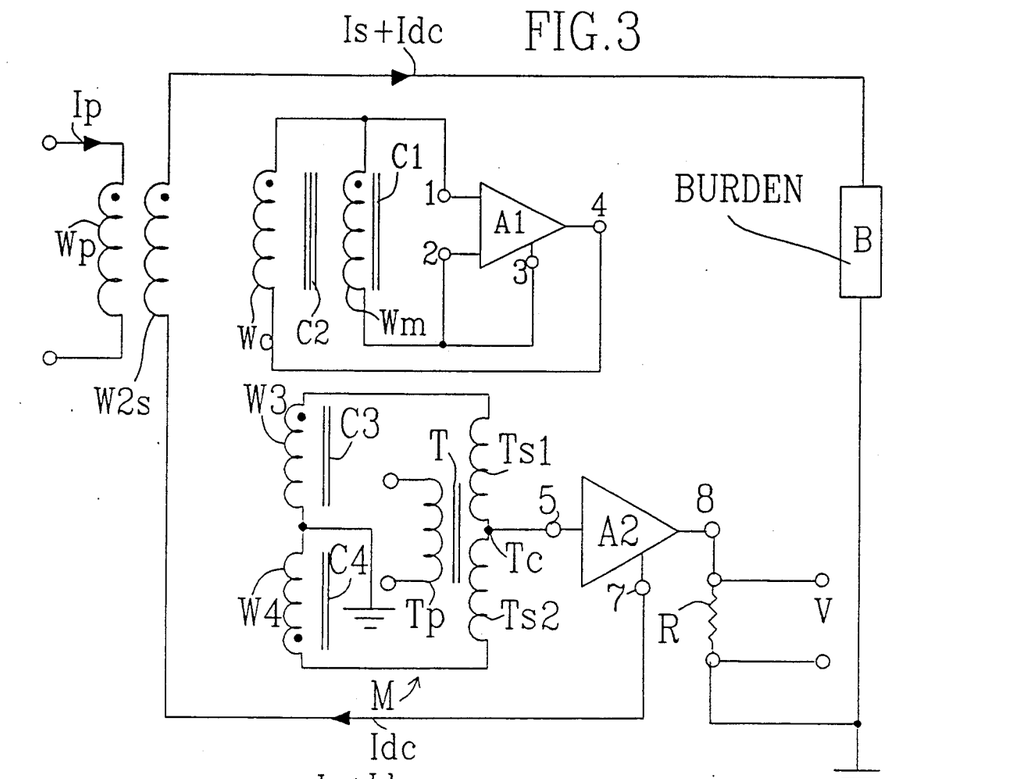
FIGS. 3 to 6 are variations of FIG. 2, that respectively show additional embodiments of the circuit aspect of the invention.

The circuit of FIG. 3 is similar to that of FIG. 2, except that the windings Ws and W2 have been combined into a single composite secondary winding W2s.

Figure 4:
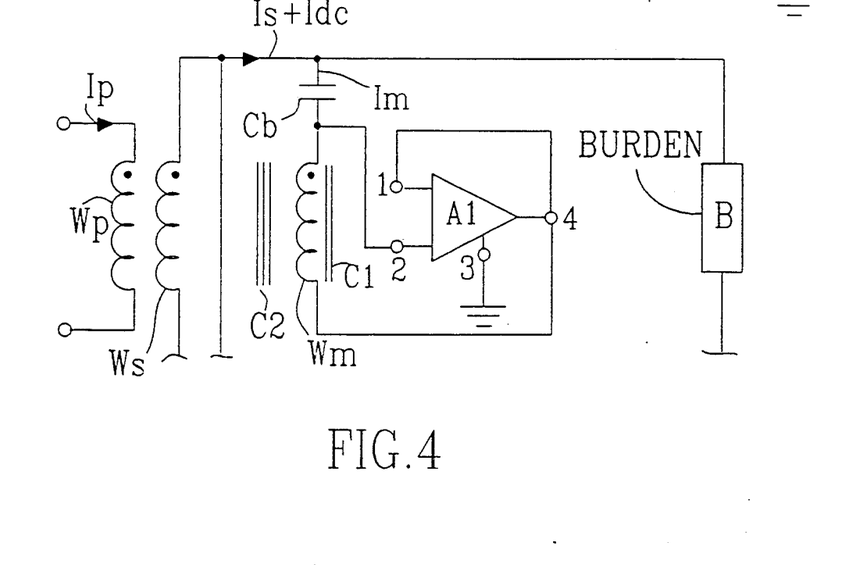

FIG. 4 shows another alternative in which the compensating winding Wc of FIGS. 1-3 has been omitted, its function having been taken over by compensating means constituted by the combination of the secondary winding Ws and the measuring winding Wm, since the output 3, 4 of the amplifier A1 now passes a current Im equal to the magnetizing current through the winding Wm and the secondary winding Ws. The lower portion of the circuit of FIG. 4 is the same as the corresponding portion of the circuit of FIG. 2, so that the direct current Idc generated, as before, by the amplifier A2 flows in a series path through the secondary winding Ws, the burden B and the resistor R, a second capacitor Cb being used to block direct current into the circuit of the amplifier A1.

As an alternative, the lower portion of the circuit of FIG. 4 can correspond to the lower portion of the circuit of FIG. 3, i.e. with the windings Ws and W2 combined into a single winding W2s. This basic alternative, i.e. two separate windings or a combined winding, applies to all the circuits.

Figure 5:
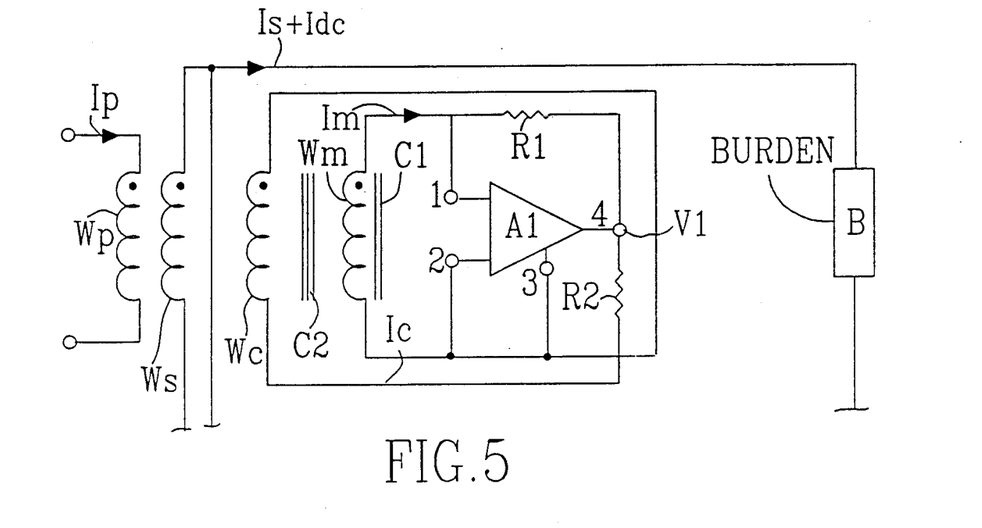

In the circuit of FIG. 2 it is necessary for the windings Ws and Wc to have the same number of turns as each other. If it is preferred to avoid this requirement, which in some instances necessitates a larger number of turns than is convenient, the more general circuit of FIG. 5 can be used. In this case, the input terminals 1, 2 of the amplifier A1 are still connected across the winding Wm, and a current Im flows in that winding from the amplifier output terminals 3, 4 and through a resistor R1. This results in a voltage V1 at terminal 4 equal to ImR1, which voltage acts through a second resistor R2 to inject into the compensating winding Wc a current Ic that magnetizes the core C2, i.e. provides the magnetizing current as before. The resistance ratio R1/R2 must be equal to the turns ratio of the windings Wm/Wc. As before, the lower portion of the circuit of FIG. 5 can be the same as FIG. 2, as shown, or the same as FIG. 3 using a combined secondary winding.

Figure 6:
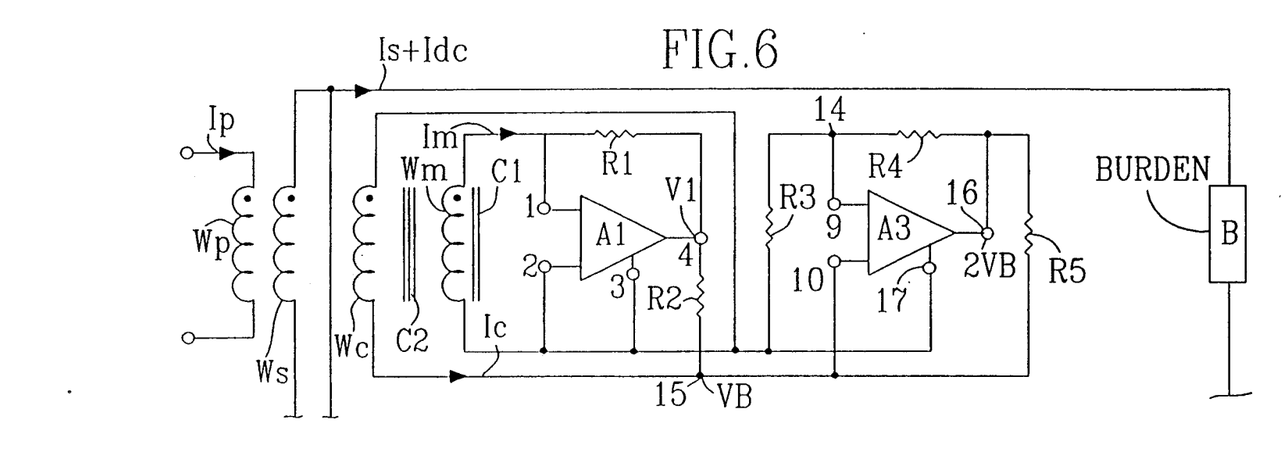

The further alternative to the upper portion of the circuit is shown in FIG. 6 and corrects for the influence of the impedance of the compensating winding Wc. The connections to the amplifier A1 are unchanged from those of FIG. 5, but a further amplifier A3 is provided to act as a voltage doubler. This amplifier A3 receives its input at terminals 9, 10 connected between a center point 14 between a pair of series-connected resistors R3, R4 of equal value, and a junction point 15 between the compensating winding Wc and the resistor R2. This serves to generate a voltage 2VB across the output terminals 16, 17 of the amplifier A3, where VB is the voltage at point 15. The current provided by the amplifier A1 and flowing through the winding Wc and the resistor R2 equals $$\frac{V1 - VB}{R2}.$$

Due to the second amplifier A3 there will now be an additional current that flows through the winding Wc and a further resistor R5 that is equal in value to the resistor R2. Such additional current will have the value.

$$\frac{2VB - VB}{R5}.$$

Since R5=R2, the total compensating current in the winding Wc becomes $$\frac{2VB - VB}{R2} + \frac{V1 - VB}{R2} = \frac{V1}{R2},$$

i.e. a current that is independent of the voltage VB across the winding Wc, and thus independent of the impedance of such winding.

It is not essential that a ratio of 2:1 be used for this circuit. If, instead of being equal in value, the resistors R4, R3 have a predetermined ratio n to each other, then the resistors R2 and R5 must meet the requirement that $$n = \frac{R4}{R3} = \frac{R5}{R2}.$$

In FIGS. 3-6 the power supplies to the amplifiers have been omitted for simplicity.

Figure 7:
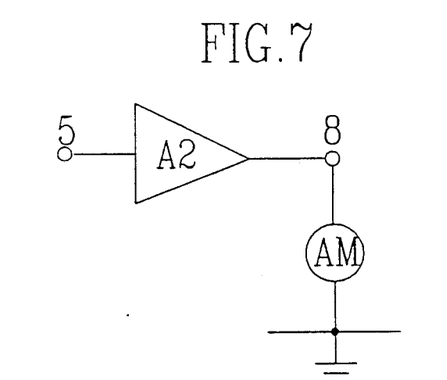
FIG. 7 is a fragment showing an alternative.

FIG. 7 shows an alternative applicable to all the circuits, in which the resistor R is replaced by an ammeter AM.

Figure 8:
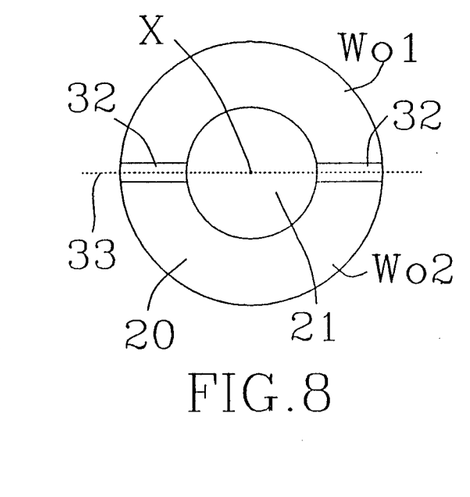
FIG. 8 is a small scale plan view of a toroidal assembly of cores and windings for implementing the circuit of FIG. 2, according to an embodiment of a structural aspect of the present invention.

FIGS. 8-11 show a preferred structural arrangement of cores and windings for the circuit of FIG. 2. FIG. 8 shows a toroidal core and winding assembly 20 defining a central hole 21 suitable for receiving a single turn primary (not shown), such as a busbar, or alternatively for the passage of convolutions of a multiple turns primary winding therethrough. The toroidal assembly 20 consist of laminated core members that in cross-section (FIG. 11) consist of inner and outer, spaced apart, side members 22 and 23 with a central bridging member 24, and top and bottom closing members 25 and 26 to complete a closed periphery. Above the central core member 24 there is a cavity 27 that is occupied by an inner core member 28 that constitutes the core C1 of the circuit diagrams, with the winding Wm wound around it and occupying the remainder of the space in the cavity 27 except for the usual insulation and epoxy (shown in black) that fill all parts of the cavity 27 (and other cavities) that would otherwise be void. Below the central core member 24 there is a further cavity 29 that is occupied by a pair of further inner core members 30 and 31 that constitute the modulation cores C3 and C4, each with its respective winding W3 and W4 wound around it, and insulation and epoxy as before. The core members 22-26 constitute the outer core C2 which, in addition to its outer periphery, effectively provides two inner magnetic circuits, one surrounding the core 28(C1) and the winding Wm, and the other surrounding the cores 30(C3), 31(C4) and the windings W3, W4. Insulation ensures that these magnetic circuits do not become short-circuited electrical turns. Outside the outer core C2 there is an outer winding assembly Wo consisting of various windings, namely the compensating winding Wc, the dc winding W2 and the secondary winding Ws when the FIGS. 2, 5 or 6 circuitry is used, or the windings W2 and Ws when the FIG. 4 circuitry is used or the windings Wc and W2s when the FIG. 3 circuitry is used. Conventional copper shields 43 and 44 with respective interruptions 45, 46 are also located respectively outside the outer core C2 and outside the outer winding assembly Wo.

While FIG. 10 shows a section on line 10—10 in FIG. 11 taken through the upper part of the toroidal structure 20, a cross-section taken lower down, e.g. through the core C3 or the core C4 would be structurally the same and hence such extra sections have not been illustrated.

Figure 9:
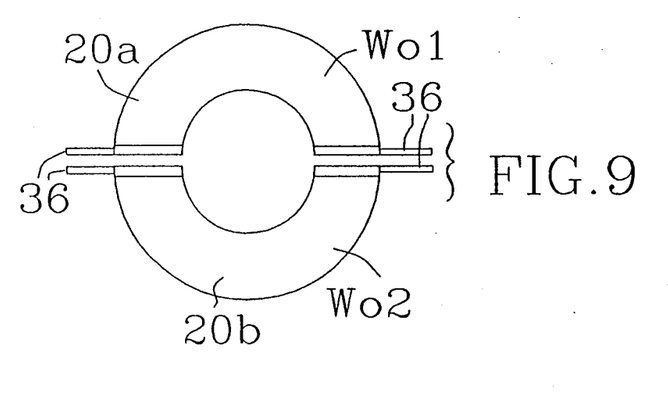
FIG. 9 shows the assembly of FIG. 8 cut into a pair of sub-assemblies.

As FIG. 8 shows, the outer winding assembly Wo will be wound as two separate halves Wo1 and Wo2. The inner windings Wm, W3 and W4 will similarly each be divided into two portions whereby between their ends to define a pair of diametrically opposite, unwound core sections 32. After a complete toroidal core and winding assembly 20 of this construction has been formed, it is cut through along a diametrical plane 33 that passes through the unwound sections 32 and contains the axis X of the toroidal assembly. The result is a pair of separate, semi-toroidal, sub-assemblies 20a and 20b, as shown in FIG. 9. These separate sub-assemblies can readily be placed over a busbar and clamped together by means of clamps (not shown) that engage members 36 that will have been secured to the sub-assemblies. Other members (not shown) can serve to support terminal boards for the winding portions, so that these can be series connected externally to effectively form continuous windings extending substantially fully around the device.

While the cut ends of the two sub-assemblies 20a, 20b will be polished in order to minimize the effective air gaps in the magnetic circuits when they are clamped together, it is impossible to avoid the cutting of the cores having a major impact on the magnetic properties of the cores, i.e. increasing their reluctances considerably. As indicated above in connection with openable cores that have been used in the past, it has always been necessary to accept the loss of accuracy consequent upon this increase in reluctance, for which reason openable core devices have never been practicable for precision measuring instruments, in particular for measuring large currents.

The present invention has overcome this disadvantage by providing circuitry that is effectively independent of the core reluctances. This effect is achieved because the magnetizing current is supplied separately and electronically from an auxiliary circuit. Hence, any increase in this magnetizing current resulting from an increase in core reluctance can be tolerated, leaving the accuracy of the device substantially unimpaired. Another advantage that flows from this insensitivity of the circuitry to increases in the reluctance of the cores, which insensitivity also extends to a tolerance for any lack of uniformity of permeability of a core throughout its length, is that all the cores C1, C2, C3 and C4 can be made of a lower grade of material. For example, it is possible to use relatively low permeability Hypersil for all these cores, which is not only less expensive but less brittle and hence more readily workable than the high permeability Supermalloy that has hitherto been considered necessary, at least for the inner core C1, if the desired accuracy was to be achieved in a non-openable core.

I claim:

1. A current ratio device for use in constructing a current transformer for measuring alternating current alone, direct current alone or a mixture of alternating and direct currents simultaneously, said device comprising (a) a first magnetic core,
(b) a second magnetic core,
(c) a measuring winding electromagnetically coupled with the first core but not with the second core,
(d) an alternating current amplifier having an input and an output,
(e) said input being connected to receive an alternating waveform appearing across the measuring winding,
(f) outer winding means electromagnetically coupled with both the first and second cores, said outer winding means including a secondary winding for connection across a measuring burden,
(g) said amplifier output being connected to said outer winding means to provide a magnetizing current required to magnetize the second core when a primary winding is electromagnetically coupled with the first and second cores and an alternating current flows in said primary winding, characterized by the addition of
(h) modulation magnetic core means,
(i) modulation winding means electromagnetically coupled with said modulation core means but not with the first and second cores,
(j) said outer winding means being electromagnetically coupled with said modulation core means,
(k) modulating means connected to drive said modulation core means alternately into saturation, and
(l) demodulating and amplifying means for detecting even harmonics in said modulation core means resulting from direct current flowing in the primary winding and for generating a corresponding direct current output connected to a direct current series circuit including said outer winding means and the burden, whereby to render said current transformer capable of measuring not only alternating current alone and direct current alone, but also measuring individually the alternating and direct current components of a mixture of alternating and direct currents regardless of the relative amplitudes of said components.

2. A device according to claim 1, including means for measuring the current in said direct current series circuit.

3. A device according to claim 2, wherein said measuring means include a resistor in said direct current series circuit, or an ammeter in said circuit.

4. A device according to claim 1, wherein the outer winding means include a direct current winding connected in parallel with the secondary winding, the direct current series circuit extending from the direct current output through said direct current winding and the burden, the device including means for preventing direct current from flowing through the secondary winding.

5. A device according to claim 1, wherein the direct current series circuit extends from the direct current output through the secondary winding and the burden.

6. A device according to claim 5, wherein the output of the alternating current amplifier is connected to the secondary winding to pass said magnetizing current therethrough.

7. A device according to claim 1, wherein the outer winding means includes a compensating winding, the output of the alternating current amplifier being connected to the compensating winding to pass said magnetizing current therethrough.

8. A device according to claim 7, wherein the measuring and compensating windings are connected in series with each other across the output of the alternating current amplifier, the number of turns of the measuring and compensating windings being equal to each other.

9. A device according to claim 7, including a first resistance of a first value connected to the output of the alternating current amplifier so that the measuring current flows through such resistance, and a second resistance of a second value connected to the output of the alternating current amplifier so that the compensating current flows through such second resistance, the ratio between the number of turns of the measuring winding and the compensation winding being equal to the ratio between said first and second resistance values.

10. A device according to claim 9, including means connected across a series connection of the alternating current amplifier output and the second resistance for causing the compensating current to be independent of the impedance of the compensating winding.

11. A device according to claim 10, wherein said last-mentioned means comprise
(i) a series connection of a pair of third resistances of values having a predetermined ratio to each other,
(ii) a further alternating current amplifier having an input and an output,
(iii) the input of the further amplifier being connected between a center point of said series connection of resistances and a junction point between the compensating winding and the second resistance,
(iv) the output of the further amplifier being connected across said series connection of resistances, and
(v) a fourth resistance having a value relative to that of the second resistance equal to said predetermined ratio, said fourth resistance being connected between the output of the further amplifier and said junction point.

12. A device according to claim 1, wherein
(i) said modulation core means comprise a pair of modulation cores,
(ii) said modulation winding means comprise a pair of modulation windings each electromagnetically coupled only with a respective one of said modulation cores, and
(iii) said modulating means comprise means for alternately passing sufficient current through a respective said modulation winding to drive the modulation cores alternately into saturation.

13. A current ratio device according to claim 1, wherein said cores are combined into a toroidal core assembly and each of said windings is divided into a pair of separate portions, each such portion extending around the toroidal core assembly for a major part of a respective opposite half thereof to define between said portions a pair of diametrically opposite unwound core sections devoid of any windings.

14. A current ratio device according to claim 13, wherein the device is cut through both said unwound core sections along a plane containing the axis of the toroidal core assembly to form a pair of separate subassemblies that can be clamped together to reform the device.

15. A current ratio device according to claim 14, wherein said toroidal core assembly comprises
(a) a toroidal outer core having a cross-section comprising a closed peripheral portion and a central bridging portion interconnecting opposite regions of said peripheral portion whereby to define a pair of cavities surrounded by the outer core, said outer core forming said second core,
(b) an inner core in one of said cavities forming said first core, said measuring winding being wound around said first core,
(c) a pair of further inner cores forming said modulation core means in the other of said cavities, such further inner cores having respective windings thereon forming said modulation winding means, and
(d) said outer winding means extending around the outside of the peripheral portion of the outer core.

16. A toroidal core assembly for a current ratio device, comprising
(a) a toroidal magnetic outer core having a cross-section comprising a closed peripheral portion and a central bridging portion interconnecting opposite regions of said peripheral portion whereby to define a pair of cavities surrounded by the outer core,
(b) a first inner core in one of said cavities and a first inner winding wound around said inner core to couple electromagnetically with said inner core but not with said outer core,
(c) a pair of further inner cores in the other of said cavities, each such further inner core having a further inner winding wound around it to couple electromagnetically with the further inner core around which it is wound but not to couple electromagnetically with any of the other cores, and (d) outer winding means extending around the outside of the peripheral portion of the outer core to couple electromagnetically with all the cores.

17. The combination of an assembly according to claim 16, and
    (e) an alternating current amplifier having an input and an output,
    (f) said input being connected to receive an alternating waveform appearing across said first inner winding,
    (g) said outer windings means including a secondary winding for connection across a measuring burden,
    (h) said amplifier output being connected to said outer winding means to provide a magnetizing current required to magnetize the outer core when a primary winding is threaded through the toroid to couple electromagnetically with all the cores and an alternating current flows in said primary winding,
    (i) modulating means connected to said further inner windings to drive said further inner cores alternately into saturation, and
    (j) demodulating and amplifying means for detecting even harmonics in said further inner windings resulting from direct current flowing in the primary winding and for generating a corresponding direct current output connected to a direct current series circuit including said outer winding means and the burden.

18. An assembly according to claim 16, wherein each of said inner windings and said outer winding means is divided into a pair of separate portions, each such portion extending around the toroidal core assembly for a major part of a respective opposite half thereof to define between said portions a pair of diametrically opposite unwound core sections devoid of any windings.

19. An assembly according to claim 18, that is cut through both said unwound core sections along a plane containing the axis of the assembly to form a pair of separate sub-assemblies that can be clamped together to reform the assembly.

20. A device according to claim 1, wherein the secondary winding and the measuring winding combine to provide compensating means, the output of the alternating current amplifier being connected to said compensating means to pass said magnetizing current therethrough.

* * * * *